(12) United States Patent
Kolsrud

(10) Patent No.: US 6,542,101 B1
(45) Date of Patent: Apr. 1, 2003

(54) METHOD AND APPARATUS FOR PERFORMING ANALOG-TO-DIGITAL CONVERSION USING PREVIOUS SIGNAL SAMPLE(S)

(75) Inventor: Arild Kolsrud, Bridgewater, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/616,158

(22) Filed: Jul. 14, 2000

(51) Int. Cl.[7] .............................. H03M 1/06; H03M 1/12
(52) U.S. Cl. ...................................... 341/155; 341/118
(58) Field of Search ............................. 341/136, 139, 341/155, 159, 120, 131, 143, 156, 158, 163, 118, 119

(56) References Cited

U.S. PATENT DOCUMENTS

| | | | | |
|---|---|---|---|---|
| 4,562,456 A | * | 12/1985 | Bolger | 348/572 |
| 5,165,100 A | | 11/1992 | Hsieh et al. | |
| 5,266,952 A | * | 11/1993 | Stone et al. | 341/156 |
| 5,379,445 A | | 1/1995 | Arnstein et al. | |
| 5,543,795 A | * | 8/1996 | Fernald | 341/163 |
| 5,808,573 A | * | 9/1998 | Shih et al. | 341/110 |
| 6,031,478 A | * | 2/2000 | Oberhammer et al. | 341/155 |
| 6,037,886 A | * | 3/2000 | Staszewski et al. | 341/139 |
| 6,100,834 A | * | 8/2000 | Lewyn | 341/155 |
| 6,252,536 B1 | * | 6/2001 | Johnson et al. | 341/155 |
| 6,335,949 B1 | * | 1/2002 | Kim | 375/232 |

FOREIGN PATENT DOCUMENTS

WO     WO 99 60704     11/1999

* cited by examiner

*Primary Examiner*—Patrick Wamsley

(57) ABSTRACT

An analog to digital conversion (A/D) system produces a corrected output of an analog to digital (A/D) converter using at least one past signal sample. For example, the A/D system estimates a reference value or point, such as a reference amplitude, for the at least one past sample. In response to an indication that the A/D converter is saturated, the A/D system uses the reference value to predict a next reference value, such as a next amplitude value, from which a corrected digital sample value is produced to replace the saturating sample.

23 Claims, 7 Drawing Sheets

METHOD AND APPARATUS FOR PERFORMING ANALOG-TO-DIGITAL CONVERSION USING PREVIOUS SIGNAL SAMPLE(S)

BACKGROUND OF THE INVENTION

1. Field of the Invention

This invention relates to analog-to-digital converters and, more particularly, to an analog-to-digital converter system for correcting the digital output of an analog to digital (A/D) converter.

2. Description of Related Art

Many physical devices generate output signals which are analog or continuously varying. Today, signal processing is often accomplished using digital methods. In many applications it is required to convert an analog signal into a digital form suitable for processing by a digital system. Many types of converters exist which act as interfaces between analog devices and digital systems. These converters are used in a variety of applications, including testing, measurement, process control, and communications. Analog-to-Digital (A/D) converters produce a digital output from an analog input. In converting analog signals to digital form, the analog signal is typically sampled and quantized. When the analog input signal to the A/D converter reaches above the full scale voltage level producing the maximum digital output value for the A/D converter, the A/D converter becomes saturated or overloaded. Once the A/D converter is saturated, the digital output cannot go above the maximum digital output value which is limited by the number of bits available at the output of the A/D converter. As the analog input signal increases above the full scale voltage level, the sudden clipping in the digital output pattern results in a massive spurious response or undesirable distortion, which can be referred to as a discontinuity, in the digital domain when a Fourier transform is taken of the digital output signal resulting from the analog input signal with the sudden clipping of the amplitude.

SUMMARY OF THE INVENTION

The present invention involves an analog to digital conversion (A/D) system which produces a corrected output of an analog to digital (A/D)) converter using at least one past signal sample. For example, the A/D system estimates a reference value or point, such as a reference amplitude, for the at least one past sample. In response to an indication that the AID converter is saturated, the A/D system uses the reference value to predict a next reference value, such as a next amplitude value, from which a corrected digital sample value is produced to replace the saturated sample.

BRIEF DESCRIPTION OF THE DRAWINGS

Other aspects and advantages of the present invention may become apparent upon reading the following detailed description and upon reference to the drawings in which.

DETAILED DESCRIPTION

Figure 1:
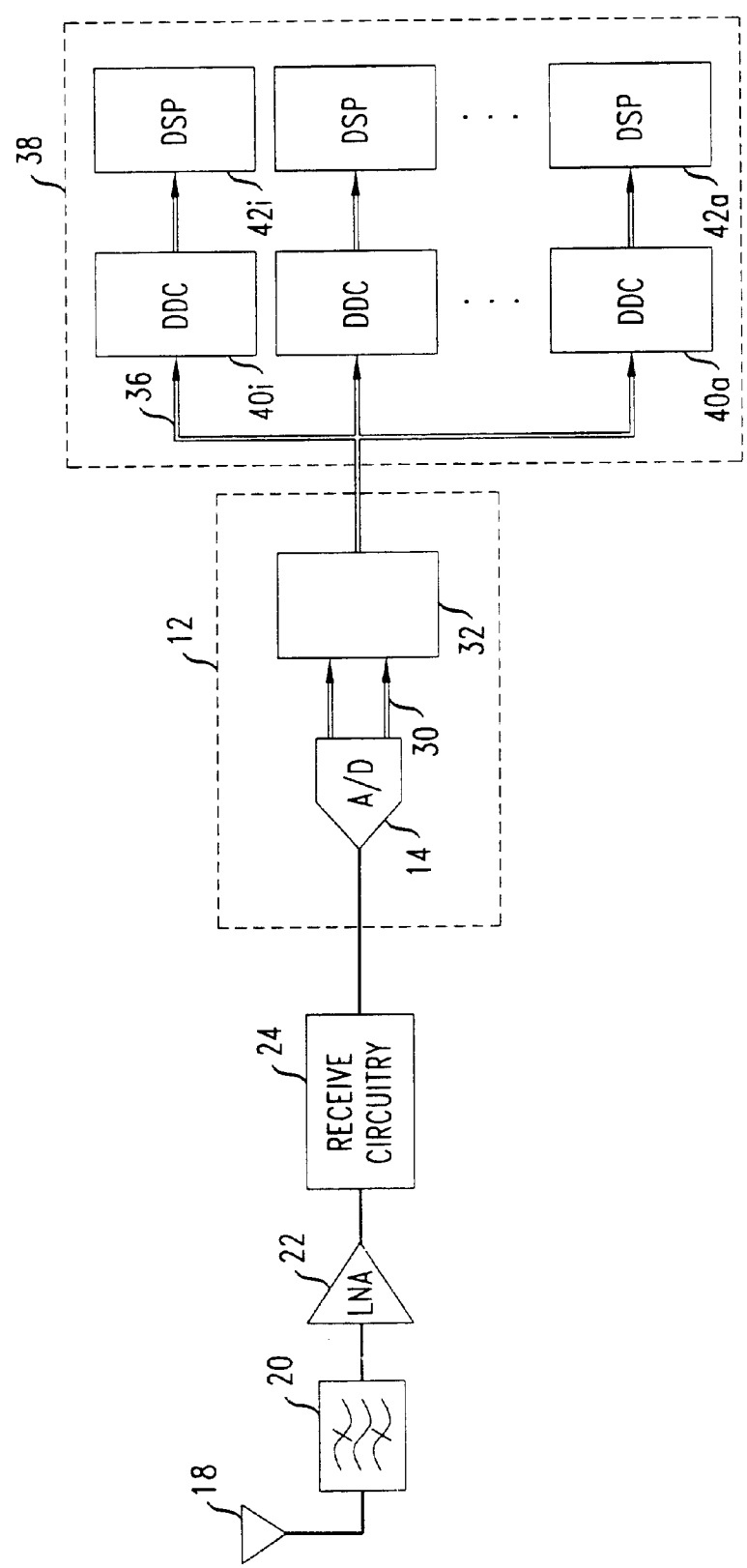
FIG. 1 shows a general block diagram of an embodiment of the A/D system according to the principles of the present invention.

Illustrative embodiments are described below of an analog to digital (A/D) converter system which reduces the problems associated with the saturation of an A/D converter by an analog input signal above the full scale input range of a main A/D converter. With particular reference to FIG. 1, a receiver system 10 includes an A/D converter system 12 which receives an analog signal to be converted into digital form by at least one analog to digital (A/D) converter 14. The A/D converter system 12 uses previous sample(s) of the signal to produce a corrected digital sample value upon an indication that the A/D converter 14 is saturated or overloaded by the analog input signal. For example, the A/D system 12 can use at least one past signal sample to determine a reference value or point relative to the past signal sample, for example a reference amplitude, such as an envelope amplitude, for the sampled signal, by relating the sampling frequency and the signal frequency. Using the reference value, the A/D system 12 can estimate and/or predict a corrected digital sample value in response to a saturated sample, for example by predicting the current reference value for the saturating sample and adjusting the reference value to obtain the corrected digital sample value. In certain embodiments, the next reference value can be predicted using a plurality of past reference values for past samples to obtain a slope, gradient or trajectory of reference values.

In this embodiment, radio frequency (RF) analog signals are received by antenna 18, and a front-end filter 20, such as a band-pass filter, filters the RF analog signals before being provided to a low noise amplifier (LNA) 22. The LNA 22 amplifies the analog signals and provides the analog signals to analog receiver circuitry 24. The A/D converter system 12 receives the analog signals to be digitally converted from the analog receiver circuitry 24. In some embodiments, if the A/D converter 14 is not overloaded, for example as indicated by an overload or over-range line 30 or by the output of the A/D converter 14, overload correction or processing circuitry 32 receives the digital output values from the first A/D converter 14 and provides the digital output values from the first A/D converter 14 as the least significant bits to a bus 36. The overload correction circuitry 30 can be implemented using a bus switch. If the A/D converter 14 is overloaded, for example as indicated by the overload line 32 or by an examination of the output bit pattern of the A/D converter 14, the overload correction circuit or processing circuitry 30 selects the digital output value calculated or estimated using at least one past sample of the signal and places the corrected digital output on the bus 36. The bus 36 provides the digitized signals to the digital radio circuitry 38, for example digital downconverters (DDCs) 40$a$–$i$ connected to associated digital signal processors (DSPs) 42$a$–$i$.

In this embodiment, the bus 36 has greater than the N bits provided by the main A/D 14. For example, the bus 36 can have N+X/6 bits where X is the relative offset or power detection level between the A/D 14 and the potential peak value of the input signal since, in this application, 1 bit in the digital domain roughly corresponds to 6 dB in the analog domain. In other embodiments, a different correspondence can exist between an amplitude value in the analog domain and a bit in the digital domain. If the A/D 14 is not overloaded or saturated, the N-bit output of the A/D 14 can be produced on the bus 36 as the N least significant bits of the bus 36. If the A/D 14 is saturated, the processing circuitry 32 can produce the corrected digital sample value based on at least one past sample using more or the most significant bits on the bus 36. The processing circuitry 32 can be implemented as a microprocessor, a microcontroller or a programmable logic device (e.g. a programmable gate array).

The processing circuitry 32 monitors or tracks the output of the A/D 14 and estimates or determines an envelope amplitude or peak value for the at least one past signal sample. The signal is bounded by an envelope, and an envelope amplitude value can be a value on the envelope of the signal corresponding to a peak value for the signal sample. When the processing circuitry 32 receives an indication that the A/D 14 is saturated, for example by receiving an overload signal on an overload line 30, the processing circuitry 32 uses the envelope amplitude value to produce a digital value with greater than N bits of amplitude, where N is the number of bits output from the A/D converter 14. When the A/D 14 is saturated, the processing circuitry 32 uses the envelope amplitude value for the at least one previous digital sample to produce the corrected digital sample value by replacing the saturating sample with a calculated or estimated digital sample value or adjusting the digital output with an estimated peak offset value. In certain embodiments, the processing circuitry 32 uses a plurality of signal samples to estimate and/or predict an envelope amplitude value, and the processing circuitry uses a plurality of envelope amplitude values to produce corrected digital sample values upon an indication that the A/D 14 is saturated.

The estimation of the envelope amplitudes is possible since the rate at which the A/D converter 14 samples the input signals, which can referred to as the sampling frequency, is much greater than the bandwidth of the underlying information signal(s) which is modulated onto the higher frequency carrier signal(s). The bandwidth of the information signal is directly related to the rate at which the information signal, such as voice, video, text and/or other data, is produced, and the information signal is modulated on a higher frequency carrier signal for transmission over the air. As such, changes in the amplitude of the input signal can be tracked by sampling the carrier signal modulated with the information signal at a sampling rate which is much greater than the information signal frequency but not much greater than the carrier frequency. Additionally, the envelope changes due to fading, the Doppler effect and the summation of multiple carrier signals, but these changes are also slow compared to the sampling frequency. Using the amplitude envelope values, envelope amplitude values can be predicted and digital sample values determined from the predicted envelope amplitude values to replace the saturating sample.

Figure 2:
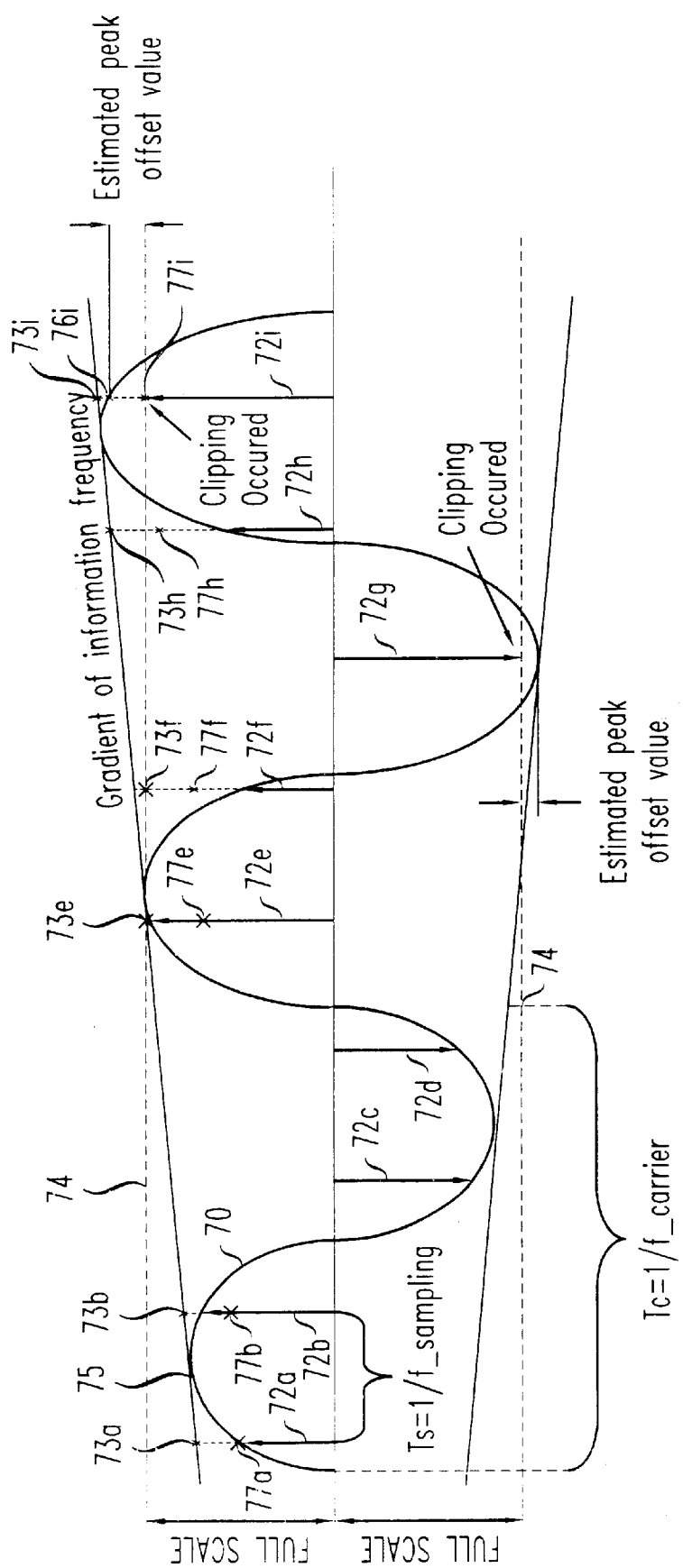
FIG. 2 shows a graphical representation used to explain how an embodiment according to the principles of the present invention corrects a digital output value for a carrier signal.

For example, for discussion purposes, FIG. 2 shows a carrier signal 70 in time with a period $T_c$ and a frequency $f_c$ ($T_c=1/f_c$). The carrier signal 70 is sampled at a sampling frequency $f_{sampling}$ with the arrows 72a–i designating samples. Threshold levels 74 represent the full scale capability of the A/D 14 such that the amplitude of the analog carrier signal can be represented by N bit digital values without saturation of the A/D 14. When the amplitude of the analog carrier signal is within the threshold levels 74, the processing circuitry 32 produces the N-bit output of the A/D 14 onto the bus 36 as the N least significant bits of the bus 36 with the remaining most significant bit(s) set low.

Since it is believed that changes in the amplitude of the carrier signal are slower than the frequency and duration of a saturating peak, the amplitude of the carrier signal is progressively increasing until the amplitude of the analog carrier signal exceeds the threshold 74, and the samples 72g and 72i are at full scale or full range but the true amplitude of the analog carrier signal is clipped. According to the principles of the present invention, the processing circuitry 32 tracks the amplitude of the signal samples. The processing circuitry 32 can search for and detect and attempt to correct for a peak that could saturate the A/D 14. For example, the processing circuitry 32 could detect that the A/D converter 14 is saturated by examining the overload line 30. By relating the sampling frequency and the carrier frequency, the envelope amplitude or peak value for a previous signal sample can be determined. Given a plurality of envelope amplitude values for previous signal samples, the processing circuitry can predict an envelope amplitude value or peak value for the saturating sample using the envelope gradient, slope or trajectory established by the previous envelope amplitude values.

For example, for discussion purposes, the previous samples 72a, 72b, 72e, 72f and 72h have corresponding amplitude envelope values or reference values 73a, 73b, 73e, 73f and 73h. The amplitude envelope values 73f and 73h and/or different amplitude envelope values can be used to establish an envelope gradient, slope or trajectory 75 from which a predicted envelope amplitude value 73i can be predicted. From the predicted envelope amplitude 73i, the processing circuitry 32 can adjust the predicted envelope amplitude value to produce the corrected digital sample value on the bus 36. The saturating sample value 72i can be adjusted by an estimated peak offset value or replaced by the adjusted predicted envelope amplitude value as the corrected digital sample value. The corrected digital sample value can be calculated by simply using estimated and/or predicted amplitude envelope values to predict the next amplitude envelope value using a gradient or trajectory of the calculated from the past envelope amplitude values. Alternatively, other reference values, such as reference amplitudes 77a, 77b, 77e, 77f and 77h can be used to predict a reference value 77i from which the corrected digital sample value 76 is determined. The signal information data in the peak (such as phase) will probably be lost but the preservation of the carrier signal envelope is at least partially achieved. The envelope of the carrier signal is thereby re-created and spectral regrowth and spurious response can be reduced. It is assumed that losing the information in one sample when the saturating sample value occurred does not substantially affect the bit error rate (BER).

Depending on the embodiment, the estimated peak offset value between the full scale threshold 74 and the adjusted sample value 76 can determine which bits in the bus 36 (FIG. 1) are used. For example, if the threshold 74 represents the range of a 12 bit A/D and the offset value is 12 dB, a 14 bit bus 36 might receive digital values using the most significant bits of the bus 36. If the offset is 6 dB, the bus 36 might not use the most significant bit which would be set low.

Figure 3A:
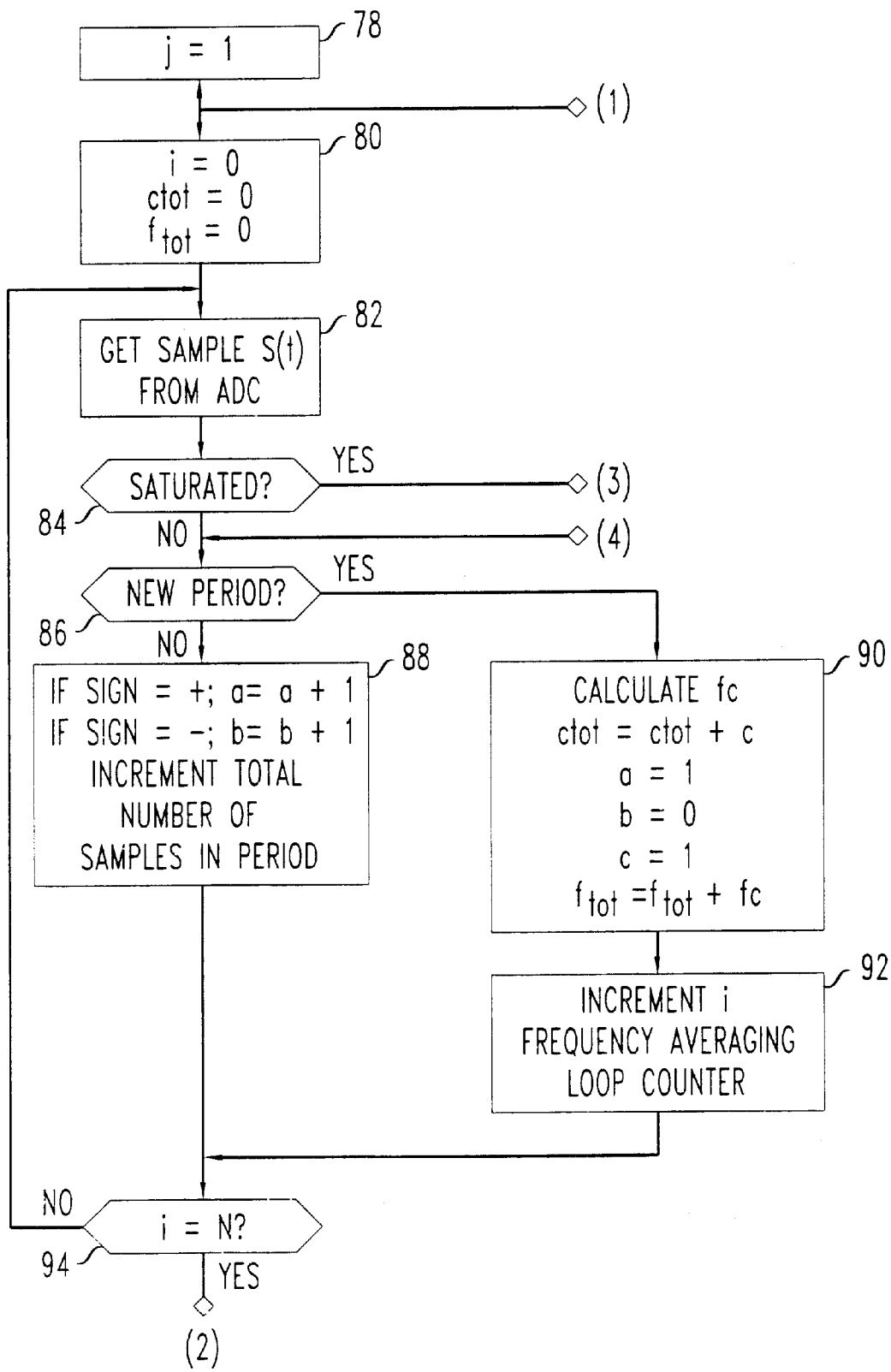
FIGS. 3A–C shows a flow diagram of an embodiment according to the principles of the present invention.
Figure 3B:
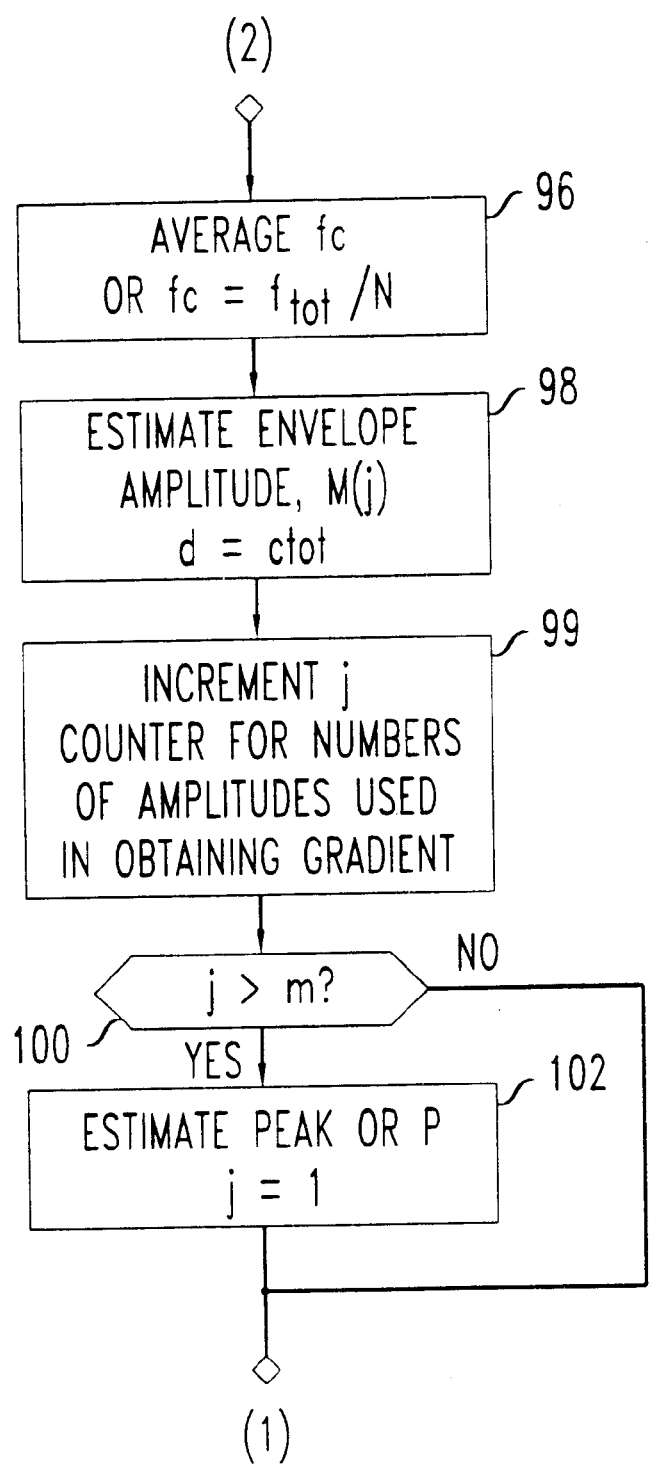
Figure 3C:
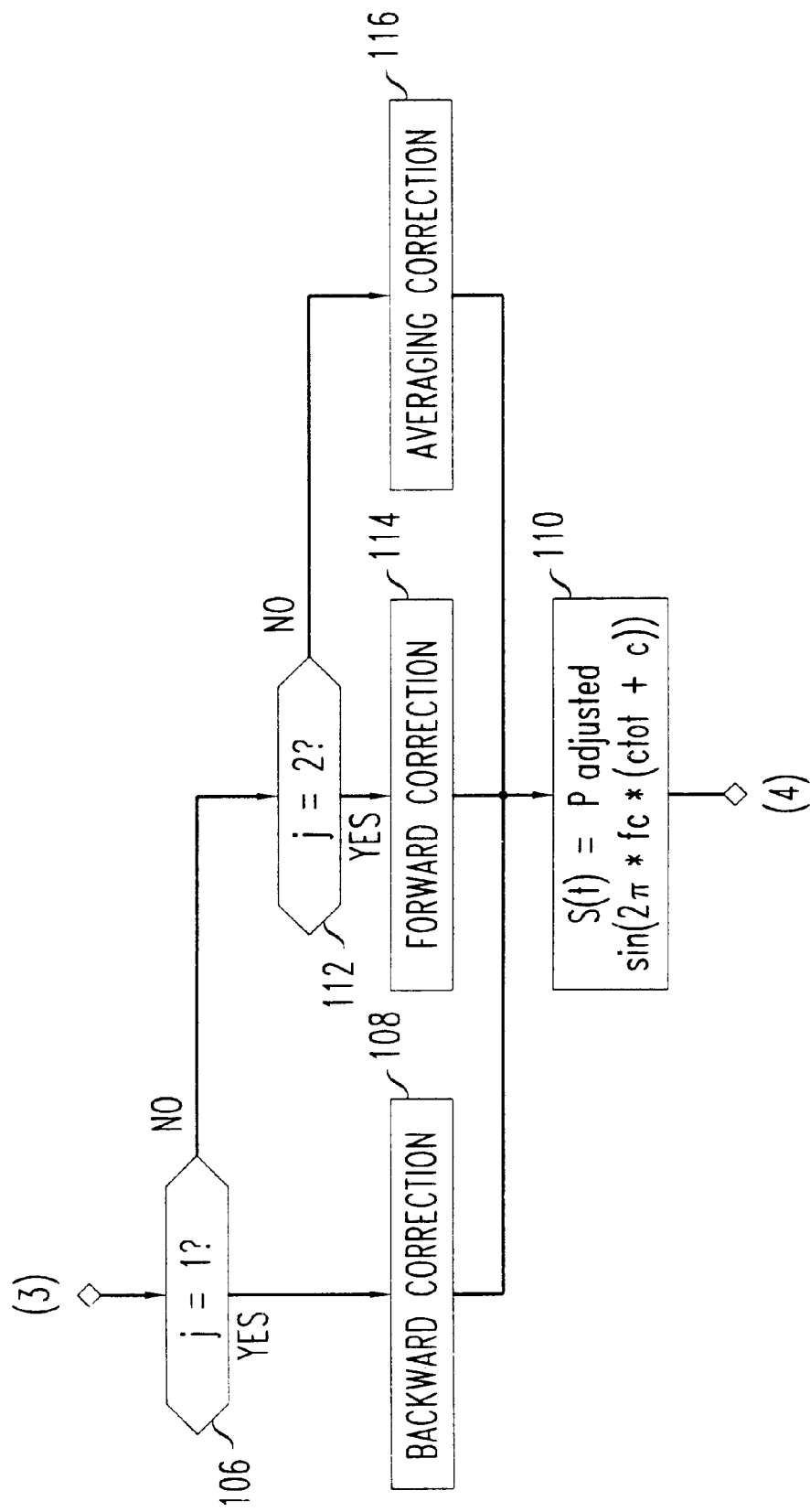

FIGS. 3A–C shows a flow diagram of how an example embodiment of the A/D adjustment scheme can operate to provide a corrected A/D output when the A/D 14 is saturated. In this embodiment, a predicted envelope amplitude for a signal to be converted by the A/D 14 is determined based on previous estimated envelope amplitudes. Where the signal frequency is not known, the estimated envelope amplitudes are determined based on an estimation of the signal frequency, for example the carrier frequency $f_c$, using a plurality of previous samples of the signal. At block 78 of FIG. 3A, the index counter j is initialized to 1 to count the number of envelope amplitudes estimated, where a plurality of the estimated envelope amplitudes are used to make a predicted envelope amplitude value. At block 80, the counter i is initialized to zero to count the number of signal periods used to get an estimated envelope amplitude value, the counter $f_{tot}$ for performing frequency averaging over an envelope amplitude estimation cycle to determine the signal frequency $f_c$, and $c_{tot}$ for determining the total number of samples taken during an envelope amplitude estimation cycle At block 82, the processing circuitry 64 receives a signal sample $S(t_n)$ from the A/D 14.

The processing circuitry 32 determines at block 84 whether the A/D 14 is saturated. If at block 84 the A/D 14 is not saturated, for example as indicated by the overload line 30, the processing circuitry 32 proceeds directly to performing a signal frequency estimation to be able to estimate the signal envelope amplitude from the sample value. For example, an A/D sample output (discrete numerical value) can be designated by the following equation:

$$S(t_n) = A_0(t)\sin(2\pi f_c t_n) \quad (1)$$

where $t_n$ is given $$t_n = \frac{n}{f_{sampling}} \quad (2)$$

and n is the discrete incremental time variable, n={1,2, ... } and t is an absolute time increment. $S(t_n)$ is the A/D sample output (discrete numerical value). $S(t_n)$ and $t_n$ are known, but the envelope $A_0(t)$ and the signal frequency $f_C$, for example the carrier frequency, can be estimated. $S(t_n)$ is bounded by the envelope $A_0(t)$ where $A_0(t)$ is dependent on fading, the Doppler effect and the summation of multiple carriers (weak and strong).

For example, if the A/D 14 is not saturated at the block 84, the processing circuitry 32 proceeds to block 86 where the processing circuitry determines whether the signal is beginning a new period, for example by examining zero crossings of the signal as indicated by the sign of the signal sample and a new period being indicated by a crossing from a negative to a positive. If the signal is not in a new period, the processing circuitry proceeds to block 88. If the sample is positive, then the counter a for the number of positive samples in a signal period is incremented by 1. If the sample is negative, then the counter b for the number of negative samples in a signal period is incremented by 1. Additionally, the counter c for the total number of samples in a signal period is also incremented by 1. Otherwise, if at block 86 a new signal period starts, the processing circuitry 32 estimates the signal frequency $f_c$ for the period, adds the signal frequency $f_c$ for the period to a total $f_{tot}$ making up the sum of the frequencies for each period used to estimate the signal frequency, increments $c_{tot}$ by c, and resets the counters for the positive (a=1), negative (b=0) and total signal samples (c=1) in a period at block 90. From block 90, the processing circuitry proceeds to block 92 to increment the counter i for the number of signal periods being used to estimate the signal frequency, for example the analog carrier frequency.

For example, the analog carrier frequency can be estimated by using $$fc = \frac{1}{\frac{1}{N}\sum_{i=1}^{N}\left(\frac{\delta_{1i}}{\delta_{2i}}\lambda_i T_{sample}\right)} \quad (3)$$

where N is the number of averages we want to do, $\delta_{1i}$ is the number of consecutive positive sign bits in period i, $\delta_2$ is the consecutive number of negative sign bits in period i and $\lambda_i$ is the total number of samples in period i, respectively. $T_{sample}$ is the time between two consecutive samples.

From blocks 88 and 92, the processing circuitry 32 determines at block 94 whether an N number of periods has passed for which the carrier frequency $f_c$ has been determined. If the counter i is not equal to N, the processing circuitry 32 proceeds to block 82 to get the next sample. Otherwise, the processing circuitry 32 proceeds to block 96 of FIG. 3B where the signal or carrier frequency is determined as an average of the frequencies calculated for each signal period, for example $f_c = f_{tot}/N$. With the estimated signal frequency $f_c$, the processing circuitry 32 can estimate the envelope amplitude or peak value for the signal sample at block 98, and the total number of samples used during the envelope amplitude estimation cycle to determine the estimated envelope amplitude is stored in the variable d.

Rearranging equation (1) and using the information in equations (2) and (3), the processing circuitry 32 in this embodiment can now estimate the envelope amplitude or peak of the signal sample as $$A_0(t) = \frac{S(t_n)}{\sin(2\pi f_c t_n)} = M(j).$$

At block 99, the processing circuitry 32 increments the index j for the next envelope amplitude to be estimated during the envelope amplitude or peak prediction cycle. The processing circuitry 32 determines at block 100 whether the desired number of estimated amplitudes have been determined for the current peak or envelope amplitude prediction cycle by determining whether the index j is greater than a desired value m. If at 100 the index j of estimated amplitudes is greater than the desired value m, the processing circuitry 32 proceeds to block 102 to estimate the predicted envelope amplitude or peak for the signal sample and resets the estimated amplitude index j to 1. In this embodiment, at block 102, using an adaptive correction factor $\lambda = M_1/P$ to determine how good the amplitude prediction cycle is working, the processing circuitry 32 can predict the envelope amplitude or peak P according to $$P = \lambda\left(\frac{M_{j-1} - M_{j-2}}{c_{tot}}\right) + M_{j-1}.$$

Afterward, the processing circuitry 32 proceeds back to the beginning of the envelope amplitude prediction cycle at block 80. Otherwise, if j<=m at block 100, the processing circuitry 32 proceeds to the beginning of the envelope amplitude estimation cycle at block 80 without determining a predicted envelope amplitude.

If, at block 84, the A/D 14 is saturated, the processing circuitry 32 proceeds to block 106 to determine where the saturation occurred during the envelope amplitude prediction cycle. If the index j=1, the processing circuitry performs backward correction at block 108 to predict the envelope amplitude of the sample using a predicted envelope amplitude and an estimated envelope amplitude where the predicted envelope amplitude is $$P_{adj} = (P - M_m)\left(\frac{c_{tot} + c}{d}\right) + M_m.$$

With the predicted envelope amplitude, the processing circuitry 32 proceeds to block 110 to produce the adjusted or corrected digital sample value by adjusting the predicted envelope amplitude as follows $S(t)=P_{adj} \sin(2\pi f_c[c_{tot}+c])$. After the corrected sample value is produced at block 10, the processing circuitry 32 proceeds back to block 86 (FIG. 3A) into the envelope amplitude estimation cycle.

If, at block 106, the index j is not equal to 1, the processing circuitry 32 proceeds to block 112 to narrow down where the saturation occurred during the envelope amplitude prediction cycle. If the index j=2, the processing circuitry 32 performs forward correction at block 114 to predict the envelope amplitude of the sample using previous estimated envelope amplitudes where the predicted envelope amplitude is $$P_{adj} = (M_1 - M_m)\left(\frac{c_{tot} + c}{d}\right) + M_1.$$

With the predicted envelope amplitude, the processing circuitry 32 proceeds to block 110 to produce the adjusted or corrected digital sample value by adjusting the predicted amplitude value as follows $S(t)=P_{adj} \sin(2\pi f_c[c_{tot}+c])$. After the corrected sample value is produced at block 110, the processing circuitry 32 proceeds back to block 86 (FIG. 3A) into the envelope amplitude estimation cycle.

If, at block 112, the index j is greater than 2, the processing circuitry 32 performs averaging correction at block 116 to predict the envelope amplitude of the sample using previous estimated envelope amplitudes where the predicted envelope amplitude is $$P_{adj} = \left(\frac{1}{j-2}\sum_{k=2}^{j-1} M_k - M_{k-1}\right)\left(\frac{c_{tot} + c}{d}\right) + M_{j-1}.$$

With the predicted envelope amplitude, the processing circuitry 32 proceeds to block 110 to produce the adjusted sample value $S(t)=P_{adj} \sin(2\pi f_c[c_{tot}+c])$. After the predicted envelope amplitude is produced at block 110, the processing circuitry 32 proceeds back to block 86 (FIG. 3A) into the envelope amplitude estimation cycle.

Thus, the above embodiment of the A/D system can use previous signal samples during an envelope amplitude estimation cycle to estimate a signal envelope amplitude value. Given a plurality of signal envelopes amplitude values, the processing circuitry can predict a signal envelope amplitude. Given at least two estimated signal envelope amplitudes or at least one estimated signal envelope amplitude and a predicted envelope amplitude, the processing circuitry 32 can adjust signal samples during saturation of the A/D 14 relative to a slope, trajectory or gradient of the envelope amplitudes or peaks of the signal sample being converted by the A/D 14. If the signal frequency is known, a single previous signal sample can be used to estimate an envelope amplitude value. In some embodiments, a single previous sample value can be used to predict a corrected sample value. For example, a signal past sample can be used to estimate or determine an envelope amplitude value which can be used to predict a corrected sample value where the previous sample $S_1(t)=A_0(t) \sin(2\pi f_c t)$ and the corrected sample is $S_2(t)=A_0(t)\delta\sin(2\pi f_c t+\Delta t^\circ)$ where $\Delta t^\circ=f_s/f_c*360^\circ$ and $\delta$ is the envelope amplitude increase based on a confidence interval. If a range for $f_c$ is known, then the value for $f_c$ can be plugged into the equation $S(t)=A_0(t)\delta \sin(2\pi f_c t+\Delta t^\circ)$ and by adjusting the envelope amplitude value and/or the carrier frequency for $S_2(t)$ above to make the actual sample value $S(t)$ equal to $A_0(t)\delta \sin(2\pi f_c t+\Delta t^\circ)$, a value for $f_c$ and/or $A_0(t)$ can be used to predict corrected digital sample values.

The embodiment of the A/D system 12 of FIGS. 3A–C performs a first order correction in that at least the last two signal envelope amplitudes or at least an estimated or determined signal envelope amplitude and a predicted signal envelope amplitude are used to produce the signal samples when the A/D 14 is in saturation. Alternatively, higher order equations could be used to produce a trajectory of the signal envelope amplitudes to predict the signal sample, or the order of the equation characterizing the envelope amplitudes or predicted envelope amplitudes could change depending on the signal envelope amplitudes and/or whether the sample amplitudes are estimated using adjusted sample amplitudes due to saturation.

Figure 4:
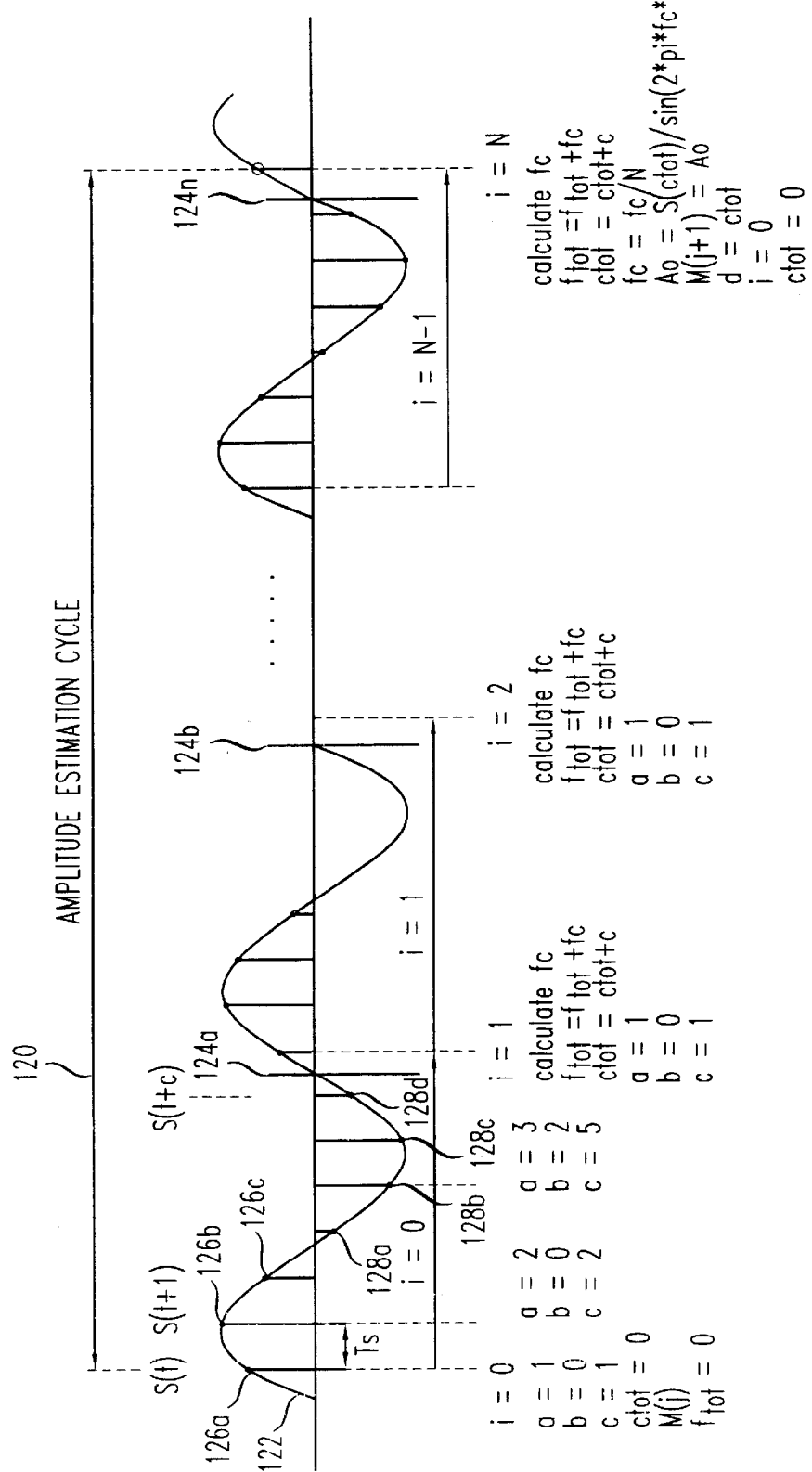
FIG. 4 is a graphical representation of how amplitude estimation is performed for an embodiment of the present invention.

In the embodiment of FIGS. 3A–C, an amplitude estimation cycle is used to provide estimated envelope amplitudes of the signal to be converted by the A/D 14. FIG. 4 shows an envelope amplitude estimation cycle 120 performed on a signal 122 to be converted using the flow diagram of FIGS. 3A–C. The envelope amplitude estimation cycle is performed over N periods 124a–n of the signal 122. The amplitude estimation cycle 120 is performed over N periods because the frequency of the signal 122 must be estimated in order to estimate an envelope amplitude value from a sample value. In this embodiment, during each signal period 124a–n, the frequency of the signal is estimated by counting the number of positive samples 126a–c ("a") and the number of negative samples 128a–d ("b"), and given the sampling frequency or time interval between samples $T_s$ and the total samples in that period ("c"), the frequency for that period can be estimated. After N periods of the signal, the average $f_c=f_{tot}/N$ of the calculated frequencies for each period is used to estimate a signal envelope amplitude. Depending on the desired accuracy, the number N of periods over which the envelope amplitude estimation cycle is performed can vary. Alternative ways of estimating or calculating the signal frequency and a signal amplitude are possible. For example, after each period, a signal amplitude could be estimated based on the period frequency, and the signal amplitudes averaged over N periods. Additionally, after a signal frequency is determined, the sample value used in determining the amplitude can vary. If the frequency $f_c$ is known or readily available, the envelope amplitude estimation cycle as described could be replaced with simply retrieving or using of the current signal frequency along with the sample value to obtain the signal envelope amplitude.

Figure 5:
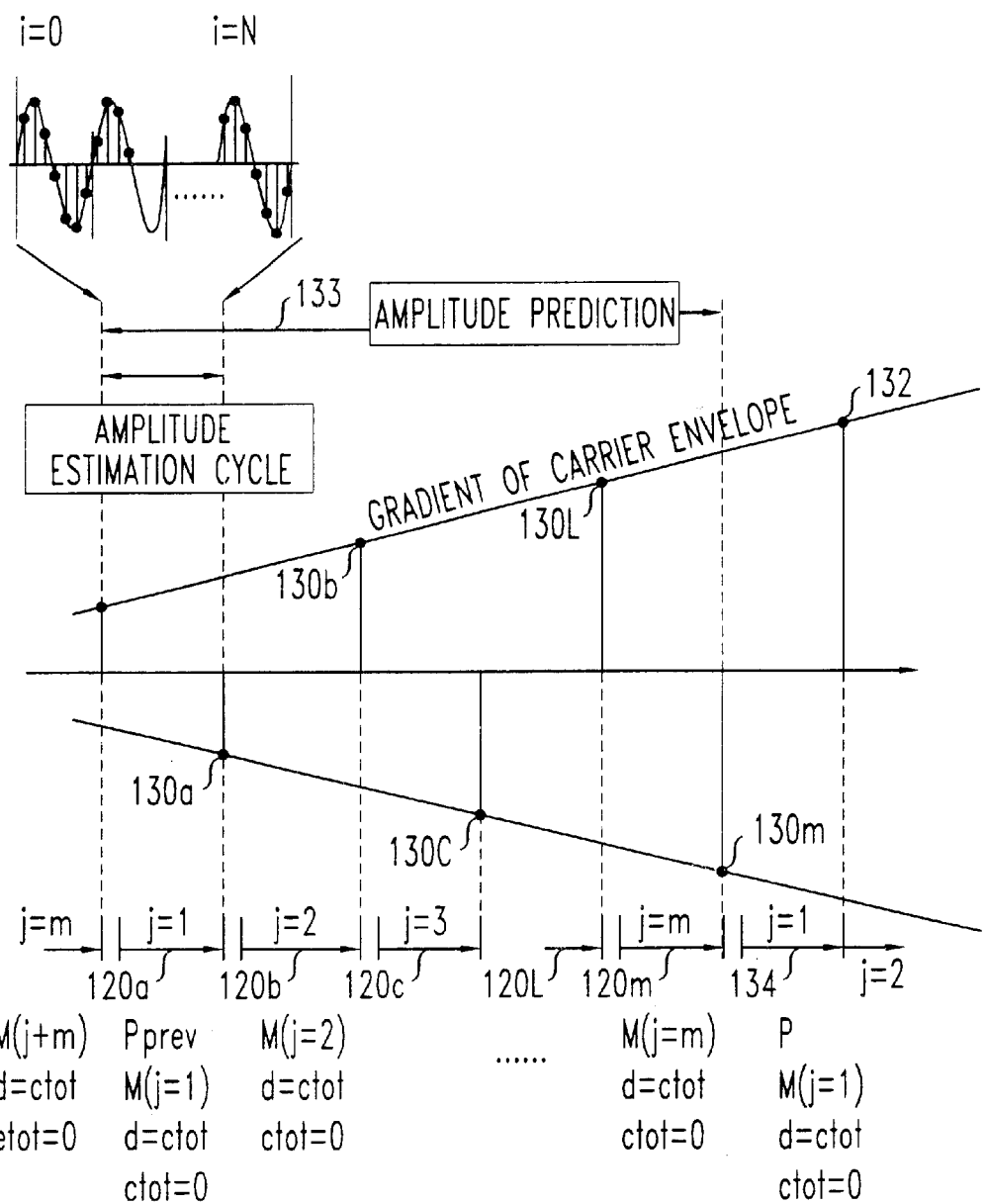
FIG. 5 is a graphical representation of how predicted peak estimation is performed in an embodiment of the present invention.

As shown in FIG. 5, a plurality of envelope amplitude values 130a–m, resulting from amplitude estimation cycles 122a–m are used to predict a predicted envelope amplitude value 132 using the gradient or slope of the estimated envelope amplitude values 130a–m calculated during an amplitude prediction cycle 133. After an amplitude estimation cycle 134, the estimated amplitude can replace the predicted envelope amplitude value 134 in any sample value corrections. If the gradient or slope is determined using a first order equation and the A/D saturates at the beginning of the amplitude prediction cycle but before the first estimated amplitude 130a is determined, the processing circuitry 32 can predict the current sample value using a slope based on the previous predicted envelope amplitude $P_{prev}$ and the last estimated envelope amplitude $M_m$ of the previous amplitude envelope estimation cycle. If the A/D saturates after the first envelope amplitude estimation cycle 120a, the processing circuitry 32 can adjust the current sample value using a slope based on the estimated envelope amplitude $M_1$ and the last estimated envelope amplitude $M_m$ of the previous amplitude estimation cycle. If the A/D saturates after the second envelope amplitude estimation cycle 120b, the processing circuitry 32 can predict the current sample value using a slope based on the estimated envelope amplitude $M_{j-1}$, and the last estimated envelope amplitude $M_{j-2}$, where $j-1 \leq m$ and $m \geq 2$. Thus, if the A/D converter saturates, the saturating sample value is adjusted or replaced on the bus 36 by the processing circuitry 32 using the predicted and/or estimated envelope amplitude values to determine an predicted envelope amplitude to be adjusted to produce the corrected signal sample for the saturating signal sample.

In this embodiment, the processing circuitry 32 determines the predicted next envelope amplitude by determining a slope, trajectory or gradient based on previous estimated and/or predicted envelope amplitude values. For example, to find the slope we can use a first order approximation y(x)=ax+b, but can use a higher order approximation, such as a second order approximation $ax^2+bx+c$, for better accuracy. In this embodiment, since we are only interested in the slope, the offset parameter b can be neglected. As such, y(x)=ax, $$a = \frac{\Delta y(x)}{\Delta x} = \frac{\partial y(x)}{\partial x} = \frac{y_2 - y_1}{x_2 - x_1},$$

where the y's represent the y's amplitudes, and the x's represent the relative time difference between the amplitudes.

Depending on the design parameters, the robustness of the design, and the particular application, different components could be used or components removed from the design. In addition to the embodiment described above, alternative configurations of the A/D system according to the principles of the present invention are possible which omit and/or add components and/or use variations or portions of the described system. For example, if the current signal frequency is available, the envelope amplitude estimation cycle need not be performed as described because at each sample in a period, the envelope amplitude of the sample can be determined. Alternatively, given the signal samples or calculated signal peaks from the signal samples, a predicted envelope amplitude value can be obtained, for example from a look-up table or using a parallel shift register of sample values. Additionally, the A/D system is described as using the at least one previous sample to provide a corrected digital sample value by using the at least one sample to determine or estimate an envelope amplitude which is used to predict an envelope amplitude for a saturating sample, and the predicted envelope amplitude is adjusted to determine the corrected digital sample value. Other embodiments can use the relationship between the signal frequency $f_c$ and the sampling frequency $f_s$ to determine reference point(s), such as envelope amplitudes, for the signal sample(s) which are normalized or made relative to the same reference position (such as the peak or envelope position) for the signal sample(s) such that the reference point(s) can be used to predict the corrected digital sample value for a saturated sample. For example, the next reference point can be predicted from the previous reference point(s) and the correct digital sample value for the saturated sample determined from the predicted reference point.

As would be understood by one of ordinary skill in the art, the various components making up the A/D system and their respective operating parameters and characteristics should be properly considered in designing the A/D system. The A/D system converts analog signals into digital form, and the analog signals or the level or amplitude thereof can be measured or represented in different ways, such as voltage, current, energy, power or intensity, but for discussion purposes, the amplitude of the analog signals in the digital domain can refer to the magnitude that the digital signal represents. In the analog frequency domain, the amplitude of the analog signals can refer to power level, and in the analog time domain, amplitude can refer to voltage level.

Furthermore, the A/D system has been described using a particular operation for processing circuitry with an A/D converter, but it should be understood that the A/D system and portions thereof can be implemented in application specific integrated circuits, software-driven processing circuitry, firmware, programmable logic devices, hardware or other arrangements of discrete components as would be understood by one of ordinary skill in the art with the benefit of this disclosure. Although in the illustrative embodiment is shown with a particular circuitry, the A/D system can use different components which together perform similar functions when compared to the circuitry shown. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

What is claimed is:

1. A method of converting an analog signal to digital form, said method comprising:

converting by an analog to digital (A/D) converter said analog signal into digital sample values;

determining an envelope gradient of said analog signal based upon one or more of said digital sample values; and producing a corrected digital sample value based at least in part upon said envelope gradient and one or more signals received from said A/D converter.

2. The method of claim 1, wherein determining an envelope gradient comprises:

determining amplitudes of said digital sample values; and producing said envelope gradient using said amplitudes.

3. The method of claim 2, wherein determining an envelope gradient comprises:

determining a signal frequency from said digital sample values in an amplitude estimation cycle; and determining amplitudes from said digital sample values and said signal frequency.

4. The method of claim 3, wherein determining amplitudes further comprises determining said amplitudes over a plurality of amplitude estimation cycles.

5. The method of claim 4, wherein determining an envelope gradient comprises predicting an amplitude value after a plurality of amplitude estimation cycles, and wherein producing a corrected digital sample value comprises using said predicted amplitude to produce said corrected digital sample value.

6. The method of claim 1, wherein producing said corrected digital sample value comprises producing said corrected digital sample value in response to said A/D converter being saturated.

7. An analog to digital (A/D) converter system for converting an analog input signal to digital form, said A/D system comprising:
- an A/D converter that receives said analog input signal and produces digital sample values;
- processing circuitry configured to produce a corrected digital sample value based upon an envelope gradient, wherein said envelope gradient is generated by said processing circuitry based upon one or more signals received from said A/D converter.

8. The system of claim 7, wherein said processing circuitry is configured to determine amplitudes from said digital sample values and produce said corrected digital sample value using said amplitudes.

9. The system of claim 8, wherein said processing circuitry determines a signal frequency from said digital sample values in an amplitude estimation cycle and an amplitude from said digital sample values and said signal frequency.

10. The system of claim 9, wherein said processing circuitry determines said amplitudes over a plurality of amplitude estimation cycles.

11. The system of claim 10, wherein said processing circuitry predicts an amplitude value after a plurality of amplitude estimation cycles and uses said predicted amplitude to produce said corrected digital sample.

12. The system of claim 7, wherein said processing circuitry is configured to produce said corrected digital sample value in response to said A/D converter being saturated.

13. A method of converting an analog signal to digital form, said method comprising:
- receiving an analog signal at an analog to digital (A/D) converter;
- converting, as said A/D converter, said analog signal to a plurality of digital sample values;
- transmitting said plurality of digital sample values to a processing circuitry; and
- calculating, at said processing circuitry, at least one corrected digital output value based upon an envelope gradient, wherein said envelope gradient is generated by said processing circuitry based at least one past digital sample of the analog signal received by said processing circuitry.

14. The method of claim 13, wherein calculating said at least one corrected digital output value comprises:
- determining amplitudes from said plurality of digital sample values; and
- producing said at least one corrected digital output value using said amplitudes.

15. The method of claim 14, wherein calculating said at least one corrected digital output value comprises:
- determining a signal frequency from said plurality of digital sample values in an amplitude estimation cycle; and
- determining an amplitude from said plurality of digital sample values and said signal frequency.

16. The method of claim 15, wherein producing said corrected digital sample value comprises determining said amplitudes over a plurality of amplitude estimation cycles.

17. The method of claim 16, wherein producing said corrected digital sample value comprises:
- predicting an amplitude value after a plurality of amplitude estimation cycles; and
- using said predicted amplitude to produce said corrected digital sample value.

18. The method of claim 13, wherein calculating said at least one corrected digital output value comprises calculating said at least one corrected digital output value in response to said A/D converter being saturated.

19. A method of converting an analog signal to digital form, said method comprising:
- converting by an analog to digital (A/D) converter said analog signal into digital sample values; and
- adjusting a digital sample value to produce a digital sample value based on an envelope gradient, wherein said envelope gradient is generated by said processing circuitry based in part on a previous digital sample of the analog signal received from said A/D converter.

20. The method of claim 19, further comprising determining at least one envelope amplitude value corresponding to said at least one previous digital sample value, wherein said determination is made when said A/D converter is not saturated.

21. The method of claim 19, wherein generation of said envelope gradient comprises determining amplitudes from said digital sample values, and wherein said digital sample value is produced using said amplitudes.

22. The method of claim 21, wherein generation of said envelope gradient comprises:
- determining a signal frequency from said digital sample values in an amplitude estimation cycle; and
- determining an amplitude from said digital sample values and said signal frequency.

23. The method of claim 22, wherein generation of said envelope gradient comprises determining said amplitudes over a plurality of amplitude estimation cycles.

* * * * *